United States Patent
Shim

(10) Patent No.: US 8,039,324 B2
(45) Date of Patent: Oct. 18, 2011

(54) IMAGE SENSOR AND METHOD OF FABRICATING THE SAME

(75) Inventor: Hee-Sung Shim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 396 days.

(21) Appl. No.: 12/258,415

(22) Filed: Oct. 26, 2008

(65) Prior Publication Data

US 2009/0127598 A1    May 21, 2009

(30) Foreign Application Priority Data

Nov. 20, 2007   (KR) .................. 10-2007-0118338

(51) Int. Cl.
*H01L 21/20* (2006.01)
(52) U.S. Cl. ........ 438/141; 257/187; 257/192; 257/195; 257/197
(58) Field of Classification Search .................. 257/187, 257/192, 195, 197, 198, 290–293, 458, 459, 257/461, 462, 517, 548, E31.057, E27.133
See application file for complete search history.

(56) References Cited

U.S. PATENT DOCUMENTS

| 7,495,306 B2 * | 2/2009 | Langguth et al. ............. 257/458 |
| 2006/0006436 A1 | 1/2006 | Mouli |
| 2006/0033126 A1 | 2/2006 | Mouli |

FOREIGN PATENT DOCUMENTS

| CN | 1650043 | 8/2005 |
| KR | 10-2007-0005807 | 1/2007 |
| KR | 10-2007-0035066 | 3/2007 |
| WO | WO 03/057942 | 7/2003 |

OTHER PUBLICATIONS

English translation of the Chinese Office Action dated May 25, 2010.

\* cited by examiner

*Primary Examiner* — Michael Shingleton
(74) *Attorney, Agent, or Firm* — Sherr & Vaughn, PLLC

(57) ABSTRACT

An image sensor includes a semiconductor substrate, a photodiode formed in the semiconductor substrate, a first impurity region formed in the semiconductor substrate spaced from the photodiode, a second impurity region formed in the semiconductor substrate spaced from the first impurity region, a first gate formed over the semiconductor substrate between the photodiode and the first impurity region, a second gate formed over the semiconductor substrate between the first impurity region and the second impurity region, a spacer formed over the fourth impurity region and a first sidewall of the second gate, and an insulating film formed over the photodiode, the first gate, the first impurity region and a second sidewall and a portion of the uppermost surface of the second gate.

Figure 1:
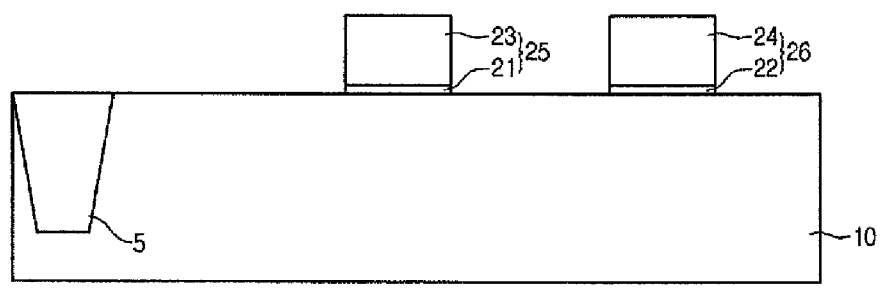

9 Claims, 4 Drawing Sheets

IMAGE SENSOR AND METHOD OF FABRICATING THE SAME

The present application claims priority under 35 U.S.C. §119 to Korean Patent Application No. 10-2007-0118338 (filed on Nov. 20, 2008), which is hereby incorporated by reference in its entirety.

BACKGROUND

An image sensor is a semiconductor device which converts an optical image into an electrical signal, and is largely divided into a charge coupled device (CCD) and a complementary metal oxide silicon (CMOS) image sensor (CIS). The CMOS image sensor has a photodiode and a MOS transistor formed within a unit pixel and is adapted to implement an image by sequentially detect electrical signals of each unit pixel using a switching method.

SUMMARY

Embodiments relate to an image sensor and a method of fabricating the same which can maximize reliability of the image sensor by minimizing the occurrence of defects caused by etching on surfaces of a photodiode and an impurity region of the image sensor.

Embodiments relate to an image sensor that may include at least one of the following: a semiconductor substrate having a photodiode including a first impurity region and a second impurity region, a first gate formed on and/or over the semiconductor substrate between the photodiode and the first impurity region, a second gate formed on and/or over the semiconductor substrate between the first impurity region and the second impurity region, a spacer formed on and/or over a sidewall of the second gate in the second impurity region, and an insulating film formed on and/or over the photodiode region, the first gate, and the first impurity region.

Embodiments relate to a method of fabricating an image sensor that may include at least one of the following: forming a first gate and a second gate on and/or over a semiconductor substrate; and then forming a photodiode including a first impurity region and a second impurity region in the semiconductor substrate on and/or over which the first and second gates are formed; and then forming a first oxide film on and/or over the semiconductor substrate on and/or over which the first and second gates are formed, and then forming a first nitride film pattern on and/or over the first oxide film of the second impurity region; and then forming a second oxide film on and/or over the first oxide film on and/or over which the first nitride film pattern is formed; and then forming a first oxide film pattern and a second oxide film pattern on the photodiode, the first gate, and the first impurity region by performing a first etch process, and then forming a spacer on and/or over a sidewall of the second gate on the second impurity region.

Embodiments relate to a method of fabricating an image sensor that may include at least one of the following: simultaneously forming a first gate and a second gate over a semiconductor substrate; and then forming a photodiode including a first impurity region and a second impurity region in the semiconductor substrate; and then simultaneously forming a third impurity region formed in the semiconductor substrate spaced from the photodiode and a fourth impurity region formed in the semiconductor substrate spaced from the third impurity region; and then sequentially forming a first oxide film and a first nitride film over the semiconductor substrate including the first and second gates and the third and fourth impurity regions; and then forming a first nitride film pattern over a portion of the first oxide film formed over the fourth impurity region, a first sidewall of the second gate and a portion of the uppermost surface of the second gate; and then forming a second oxide film over a remaining portion of the first oxide film; and then simultaneously forming a first oxide film pattern and a second oxide film pattern over the photodiode, the first gate, the third impurity region, a second sidewall of the second gate and a portion of the uppermost surface of the second gate while also forming a spacer over the fourth impurity region and on the first sidewall of the second gate.

Embodiments relate to an apparatus that may include at least one of the following: a semiconductor substrate; a photodiode formed in the semiconductor substrate; a first impurity region formed in the semiconductor substrate spaced from the photodiode; a second impurity region formed in the semiconductor substrate spaced from the first impurity region; a first gate formed over the semiconductor substrate between the photodiode and the first impurity region; a second gate formed over the semiconductor substrate between the first impurity region and the second impurity region; a spacer formed over the fourth impurity region and a first sidewall of the second gate; and an insulating film formed over the photodiode, the first gate, the first impurity region and a second sidewall and a portion of the uppermost surface of the second gate.

Embodiments relate to an image sensor that may include at least one of the following: a semiconductor substrate; a photodiode including a first impurity region and a second impurity region formed in the semiconductor substrate; a third impurity region formed in the semiconductor substrate spaced from the first impurity region and the second impurity region; a fourth impurity region formed in the semiconductor substrate spaced from the third impurity region; a first gate formed over the semiconductor substrate between the photodiode and the third impurity region; a second gate formed over the semiconductor substrate between the third impurity region and the fourth impurity region; a spacer formed over the fourth impurity region and a first sidewall of the second gate; and an insulating film formed over the photodiode, the first gate, the third impurity region and a second sidewall and a portion of the uppermost surface of the second gate.

DRAWINGS

Example FIGS. 1 to 8 illustrate a method of fabricating an image sensor in accordance with embodiments.

DESCRIPTION

Although reference is made to the example drawings of a structure regarding a CMOS image sensor (CIS), embodiments are not limited to the CMOS image sensor, but can be applied to all image sensors including a CCD image sensor.

As illustrated in example FIG. 1, first gate 25 and second gate 26 are formed on and/or over semiconductor substrate 10 in which isolation film 5 is formed. Isolation film 5 can be formed by forming a trench in semiconductor substrate 10 and gap-filling the trench with insulating material. Semiconductor substrate 10 can be a high-concentration $p^{++}$ type silicon substrate and have a low-concentration p-type epitaxial layer formed thereon and/or thereover. This can increase the depletion region of a photodiode significantly and deeply due to the existence of the low-concentration p-type epitaxial layer, and therefore, can increase the ability of the photodiode for collecting optical charges. When the high-concentration $^{++}$type substrate is provided under the p-type epitaxial layer, optical charges are recombined before the optical charges diffuse into neighboring unit pixels. Accordingly, random diffusion of the optical charges can be reduced and a change in the transfer function of the optical charges can be decreased.

First gate 25 is formed of first oxide film pattern 21 and first polysilicon pattern 23. Second gate 26 is formed of second oxide film pattern 22 and second polysilicon pattern 24. First gate 25 and second gate 26 can be formed at the same time by forming a first oxide film and a first polysilicon film on and/or over semiconductor substrate 10 and then performing a first etching process. First gate 25 can become a transfer gate and second gate 26 can become a reset gate. While embodiments illustrate that first gate 25 and second gate 26 are formed from polysilicon, it is not limited thereto. For example, first gate 25 and second gate 26 can be formed of a metal silicide film.

Figure 2:
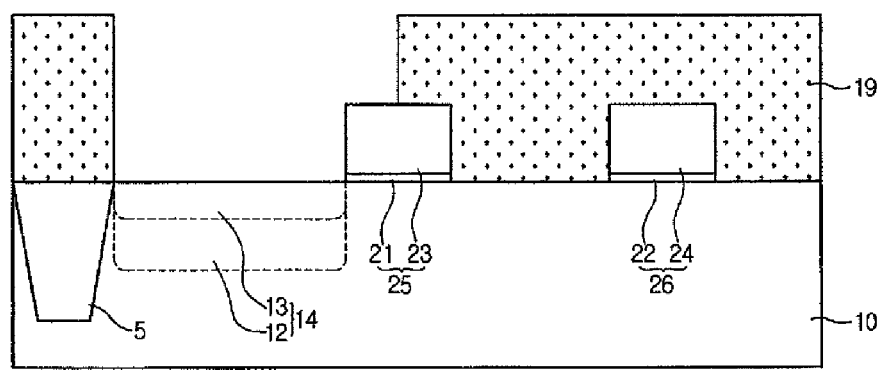

As illustrated in example FIG. 2, first photoresist pattern 19 is formed on and/or over semiconductor substrate 10 including isolation film 5, first gate 25 and second gate 26. A first ion implantation process and a second ion implantation process are then performed to thereby form photodiode 14. Photodiode 14 can be formed to include first impurity region 12 is formed by performing the first ion implantation process using first photoresist pattern 19 as a mask and second impurity region 13 is then formed by performing the second ion implantation process. First impurity region 12 can be formed by injecting an n-type impurity and second impurity region 13 can be formed by injecting a p-type impurity. First impurity region 12, second impurity region 13 and semiconductor substrate 10 come in contact with one another and may operate as a PNP photodiode.

Figure 3:
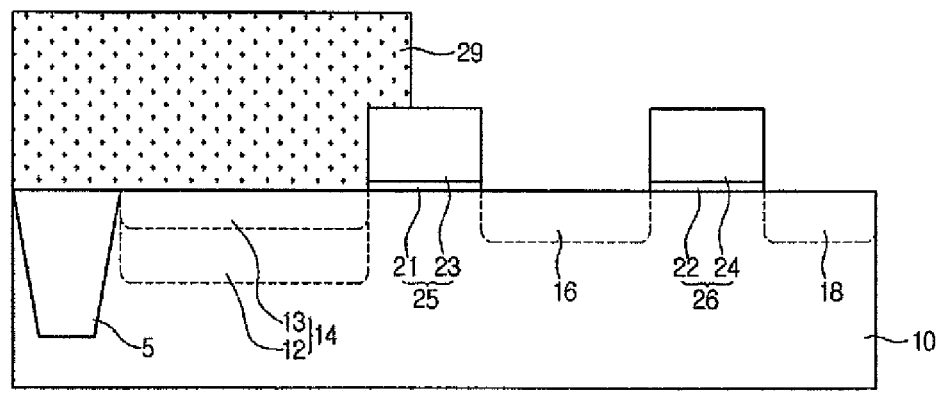

As illustrated in example FIG. 3, after first photoresist pattern 19 is removed, second photoresist pattern 29 is formed on and/or over semiconductor substrate 10 including isolation film 5, photodiode 14 and first gate 25. A third ion implantation process is then carried out in order to form third impurity region 16 in semiconductor substrate 10 between first gate 25 and second gate 26 and fourth impurity region 18 in semiconductor substrate 10. Third impurity region 16 and fourth impurity region 18 can be formed by injecting an n-type impurity. Third impurity region 16 can operate as a floating diffusion region. Optical charges generated from photodiode 14 are transmitted to third impurity region 16 by first gate 25 and then transmitted to a circuit unit. Second gate 26 can discharge the optical charges stored in third impurity region 16 in order to detect a next signal.

Figure 4:
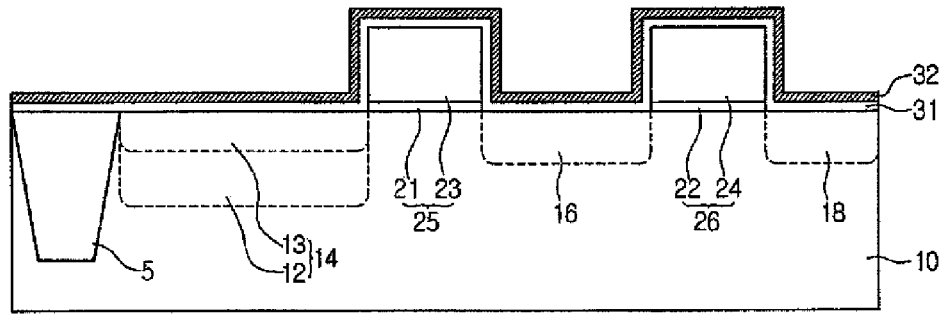

As illustrated in example FIG. 4, after second photoresist pattern 29 is removed, second oxide film 31 and nitride film 32 are formed on and/or over semiconductor substrate 10, including isolation film 5, photodiode 14, first impurity region 16, second impurity region 18, first gate 25 and second gate 26.

Figure 5:
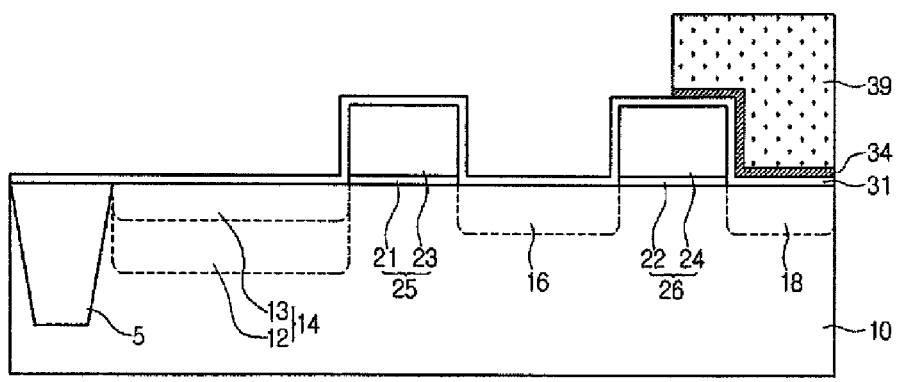

As illustrated in example FIG. 5, first nitride film pattern 34 is formed by performing a second etch process on nitride film 32. First nitride film pattern 34 is formed on and/or over a portion of second oxide film 31 formed on and/or over a sidewall and a portion of the uppermost surface of second gate 26 and also fourth impurity region 18. First nitride film pattern 34 is formed by forming third photoresist pattern 39 on and/or over the portion of second oxide film 31 formed on and/or over the sidewall and the portion of the uppermost surface of second gate 26 and also fourth impurity region 18 and then performing a second etching process removing a portion of nitride film 32 formed on and/or over photodiode 14, first gate 25 and third impurity region 16 can be removed. The second etch process can be performed using a dry etch or wet etch process. Removal of a portion of nitride film 32 formed on and/or over isolation film 5, photodiode 14, first gate 25, third impurity region 16 and a sidewall and a portion of the uppermost surface of second gate 26 is to facilitate the subsequent formation of a contact in third impurity region 16 and also prevent the a decrease in sensitivity of photodiode 14 due to nitride film 32.

Figure 6:
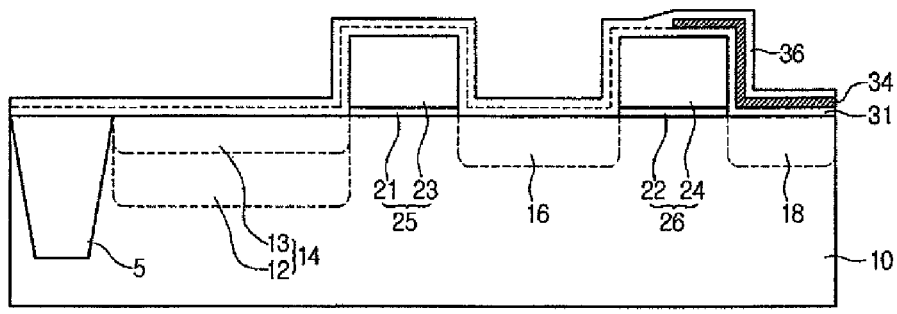

As illustrated in example FIG. 6, after third photoresist pattern 39 is removed, third oxide film 36 is formed on and/or over second oxide film 31 and first nitride film pattern 34. Accordingly, an oxide-nitride-oxide (ONO) stacked film that includes second oxide film 31, first nitride film pattern 34, and third oxide film 36 is formed on and/or over fourth impurity region 18. Second oxide film 31 and third oxide film 36 are stacked on and/or over photodiode 14, first gate 25 and third impurity region 16 a sidewall and a portion of the uppermost surface of second gate 26.

Figure 7:
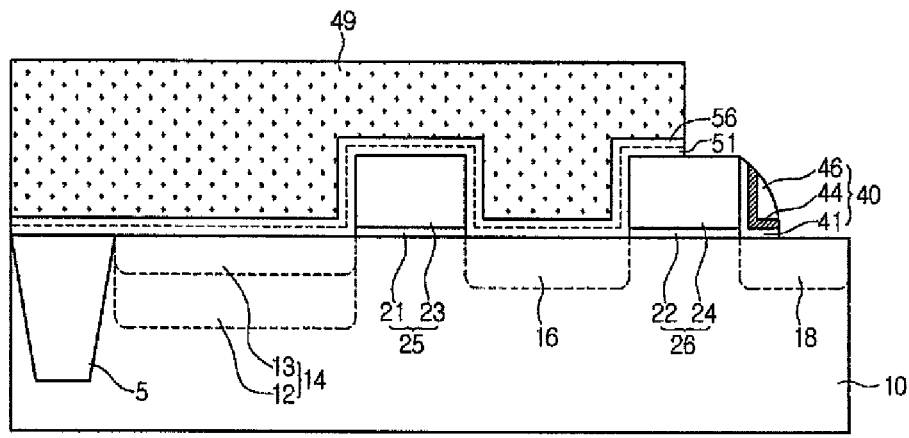

As illustrated in example FIG. 7, a third etching process is performed in order to form spacer 40 on a sidewall of second gate 26 and fourth impurity region 18. Spacer 40 can be formed by forming a fourth photoresist pattern 49 on and/or over isolation film 5, photodiode 14, first gate 25, third impurity region 16 and the other sidewall and the other portion of the uppermost surface of second gate 26 and then performing the third etch process. The third etch process is performed using an anisotropic etch process. Through the third etch process, fifth oxide film pattern 51, sixth oxide film pattern 56 and spacer 40 are formed at the same time. Spacer 40 can include third oxide film pattern 41, second nitride film pattern 44 and fourth oxide film pattern 46 formed on and/or over the sidewall of second gate 26 and fourth impurity region 18 through the third etch process. Thus, only fifth oxide film pattern 51 and sixth oxide film pattern 56 remain on and/or over isolation film 5, photodiode 14, first gate 25, third impurity region 16 and the other sidewall and the other portion of the uppermost surface of second gate 26. Since fourth photoresist pattern 49 is formed over isolation film 5, photodiode 14, first gate 25, third impurity region 16 and the other sidewall and the other portion of the uppermost surface of second gate 26, photodiode 14 and third impurity region 16 are not etched so that damage thereto due to etching can be prevented. Particularly, fourth photoresist pattern 49 prevents damage to photodiode 14 and third impurity region 16 during etching that would otherwise cause the dark characteristic of the semiconductor device is influenced, thereby degrading the device. In accordance with embodiments, fourth photoresist pattern 49 is formed on and/or over photodiode 14 and third impurity region 16 so that such damage thereto can be prevented.

Figure 8:
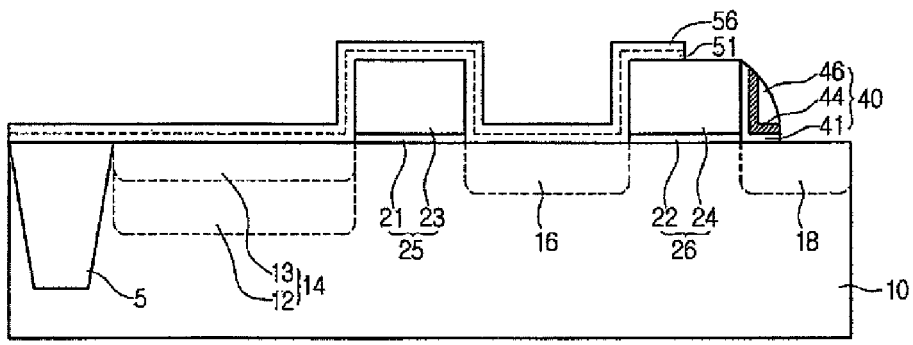

As illustrated in example FIG. 8, fourth photoresist pattern 49 is removed. Accordingly, fifth oxide film pattern 51 and sixth oxide film pattern 56 are formed on and/or over semiconductor substrate 10 including isolation film 5, photodiode 14, first gate 25 and a sidewall and portion of the uppermost surface of second gate 26. Spacer 40 can be formed only on and/or over the other sidewall of second gate 26 and fourth impurity region 18. A metal line layer, a color filter array, and one or more corresponding micro lenses can be formed on and/or over semiconductor substrate 10. Such an image sensor and the method of fabricating the same in accordance with embodiments can prevent damage due to etching on the photodiode and a floating diffusion region and therefore prevent degradation of a device due to a dark characteristic.

The image sensor in accordance with an embodiment includes semiconductor substrate 10 in which photodiode 14 including third impurity region 16 and fourth impurity region 18 are formed. First gate 25 includes first oxide film pattern 21 and first polysilicon pattern 23 and is formed on and/or over semiconductor substrate 10 between photodiode 14 and third impurity region 16. Second gate 26 includes second oxide film pattern 22 and second polysilicon pattern 24 and is formed on and/or over semiconductor substrate 10 between third impurity region 16 and fourth impurity region 18. Spacer 40 includes third oxide film pattern 41, nitride film pattern 44 and fourth oxide film pattern 46 and is formed on and/or over the other sidewall of second gate 26 and fourth impurity region 18. Fifth oxide film pattern 51 and sixth oxide film pattern 56 are formed on and/or over at least isolation film 5, photodiode 14, first gate 25, third impurity region 16 and the other sidewall and a portion of the uppermost surface of second gate 26. Third impurity region 16 can serve as a floating diffusion region.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating an image sensor comprising:
   simultaneously forming a first gate and a second gate over a semiconductor substrate; and then
   forming a photodiode including a first impurity region and a second impurity region in the semiconductor substrate; and then
   simultaneously forming a third impurity region formed in the semiconductor substrate spaced from the photodiode and a fourth impurity region formed in the semiconductor substrate spaced from the third impurity region; and then
   sequentially forming a first oxide film and a first nitride film over the semiconductor substrate including the first and second gates and the third and fourth impurity regions; and then
   forming a first nitride film pattern only over a portion of the first oxide film formed over the fourth impurity region, a first sidewall of the second gate and a first portion of the uppermost surface of the second gate, the first nitride film pattern not covering the entire uppermost surface of the second gate; and then
   forming a second oxide film over a remaining portion of the first oxide film and the first nitride film pattern; and then
   simultaneously forming a first oxide film pattern, a second oxide film pattern and a spacer, wherein the first oxide film pattern and the second oxide film pattern are formed over the photodiode, the first gate, the third impurity region, a second sidewall of the second gate and a second portion of the uppermost surface of the second gate and the spacer is formed over the fourth impurity region and on the first sidewall of the second gate.

2. The method of claim 1, wherein forming the first nitride film pattern comprises:
   forming a photoresist pattern over a portion of the first nitride film formed over the fourth impurity region, the first sidewall of the second gate and the portion of the uppermost surface of the second gate; and then
   performing an etching process using the photoresist pattern as a mask such that the first nitride film portions formed over the photodiode, the first gate, the third impurity region, the second sidewall of the second gate and the second portion of the uppermost surface of the second gate are removed.

3. The method of claim 2, wherein the etching process comprises a dry etching process.

4. The method of claim 2, wherein the etching process comprises a wet etching process.

5. The method of claim 1, wherein simultaneously forming the first oxide film pattern, the second oxide film pattern and the spacer comprises:
   forming a photoresist pattern over the photodiode, the first gate, the third impurity region, the second sidewall of the second gate and the second portion of the uppermost surface of the second gate; and then
   performing an etching process using the photoresist pattern as a mask.

6. The method of claim 5, wherein the etching process exposes the first portion of the uppermost surface of the second gate.

7. The method of claim 1, wherein the second impurity region is formed over the first impurity region and is coplanar with the uppermost surface of the semiconductor substrate.

8. The method of claim 1, wherein the spacer comprises a third oxide film pattern, a second nitride film pattern and a fourth oxide film pattern.

9. The method of claim 1, wherein the second impurity region comprises a floating diffusion region.

* * * * *